(12) United States Patent  
Cullen et al.

(10) Patent No.: US 8,836,409 B1
(45) Date of Patent: Sep. 16, 2014

(54) SYSTEMS AND METHODS FOR CONFIGURING A SWITCH

(71) Applicant: Xilinx, Inc., San Jose, CA (US)

(72) Inventors: Edward Cullen, Clane (IE); April M. Graham, Dublin (IE); Ionut C. Cical, Dublin (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/792,949

(22) Filed: Mar. 11, 2013

(51) Int. Cl.
*H03K 17/687* (2006.01)

(52) U.S. Cl.
CPC .................................... *H03K 17/687* (2013.01)
USPC .......................................... 327/434; 327/437

(58) Field of Classification Search
USPC .................................................. 327/434, 437
See application file for complete search history.

(56) References Cited

U.S. PATENT DOCUMENTS

| | | | |
|---|---|---|---|
| 6,249,410 B1* | 6/2001 | Ker et al. ......................... 361/56 |
| 7,362,145 B2* | 4/2008 | Takemura et al. ............ 327/108 |
| 8,228,115 B1 | 7/2012 | Cullen | |
| 2003/0094980 A1* | 5/2003 | Ajit ................................ 327/112 |
| 2004/0017229 A1* | 1/2004 | Ajit ................................ 327/112 |
| 2007/0070741 A1* | 3/2007 | Kim et al. ...................... 365/201 |
| 2009/0315118 A1* | 12/2009 | Yu .................................. 257/369 |
| 2013/0033289 A1* | 2/2013 | Monga ............................ 326/81 |
| 2013/0193491 A1* | 8/2013 | Salman ......................... 257/272 |
| 2014/0009205 A1* | 1/2014 | Madan et al. ................. 327/379 |
| 2014/0009206 A1* | 1/2014 | Madan et al. ................. 327/379 |
| 2014/0009207 A1* | 1/2014 | Cebi et al. ..................... 327/384 |
| 2014/0028357 A1* | 1/2014 | Mehta et al. .................. 327/109 |
| 2014/0103970 A1* | 4/2014 | Yang et al. .................... 327/109 |

* cited by examiner

*Primary Examiner* — Adam Houston
(74) *Attorney, Agent, or Firm* — Gerald Chan

(57) ABSTRACT

An apparatus includes: a switch having a first transistor, the first transistor having a gate, wherein the switch is connected between a first pad and a second pad; and a first biasing circuit coupled to the gate of the first transistor, wherein the first biasing circuit is configured for outputting a first voltage, the first voltage being the lowest one of (1) a voltage of the first pad, (2) a voltage of the second pad, and (3) a ground voltage; wherein the gate of the first transistor is driven by the first voltage from the first biasing circuit in response to an enable signal being set for configuring the switch to be off.

20 Claims, 6 Drawing Sheets

SYSTEMS AND METHODS FOR CONFIGURING A SWITCH

FIELD OF THE APPLICATION

An embodiment described herein relates to switches for single-ended and differential signal systems.

BACKGROUND

Transistors are used as switches in many integrated circuit systems. By altering the voltage at the gate of a transistor, current flow between the source and drain may be controlled. Transistor-based switches may be used in both single-ended signal systems, and in differential signal systems.

One problem with transistor-based switches is that when the voltage on the terminals of the switch exceeds supply or goes below ground, the switch may turn on when it is supposed to be off. Previous methods of solving this problem have generally utilized multiple sets of transistors so that at least one transistor between the terminals of the switch would remain off regardless of voltage swings. However, these implementations will tend to increase the area costs consumed by the switch, as well as increasing load capacitance and leakage on the terminals. In some implementations, such as when used as part of a differential termination scheme, the transistors in the switch may have to be sized to achieve a predetermined overall resistance between the terminals of the switch. The requirement for the switch to achieve a certain resistance may potentially further increase the area costs of switches with multiple sets of transistors.

Thus, there may be a need for an area-efficient switch that remains off even when the voltages at the terminals of the switch exceed supply or fall below ground.

SUMMARY

An apparatus includes: a switch having a first transistor, the first transistor having a gate, wherein the switch is connected between a first pad and a second pad; and a first biasing circuit coupled to the gate of the first transistor, wherein the first biasing circuit is configured for outputting a first voltage, the first voltage being the lowest one of (1) a voltage of the first pad, (2) a voltage of the second pad, and (3) a ground voltage; wherein the gate of the first transistor is driven by the first voltage from the first biasing circuit in response to an enable signal being set for configuring the switch to be off.

Optionally, the first transistor, when switched off, may remain off when the voltage of the first pad or the voltage of the second pad is below the ground voltage.

Optionally, the apparatus may further include an inverter coupled between the first biasing circuit and the gate of the first transistor.

Optionally, the first transistor may comprise an NMOS transistor.

Optionally, the apparatus may further include a second transistor connected in parallel to the first transistor.

Optionally, the apparatus may further include a second biasing circuit coupled to a gate of the second transistor, wherein the second biasing circuit is configured for outputting a second voltage, the second voltage being the highest one of (1) the voltage of the first pad, (2) the voltage of the second pad, and (3) a supply voltage.

Optionally, the second transistor, when switched off, may remain off when the voltage of the first pad or the voltage of the second pad is above the supply voltage.

Optionally, the second transistor may comprise a PMOS transistor.

Optionally, the apparatus may also include an inverter coupled between the second biasing circuit and the gate of the second transistor.

Optionally, the apparatus may also include a resistor, wherein the first transistor is connected in series with the resistor.

Optionally, the switch may be a part of a differential signal system.

An apparatus includes: a switch having a first transistor, the first transistor having a gate, wherein the switch is connected between a first pad and a second pad; and a first biasing circuit coupled to the gate of the first transistor, wherein the first biasing circuit is configured for outputting a first voltage, the first voltage being the highest one of (1) a voltage of the first pad, (2) a voltage of the second pad, and (3) a supply voltage; wherein the gate of the first transistor is driven by the first voltage from the first biasing circuit in response to an enable signal being set for configuring the switch to be off.

Optionally, the apparatus may also include an inverter coupled between the first biasing circuit and the gate of the first transistor.

Optionally, the first transistor may comprise a PMOS transistor.

Optionally, the apparatus may also include a resistor, wherein the first transistor is connected in series with the resistor.

Optionally, the switch may be a part of a differential signal system.

A method for configuring a switch connected between a first pad and a second pad, includes: biasing a first circuit to provide a first voltage, wherein the first voltage is the lowest one of (1) a voltage of the first pad, (2) a voltage of the second pad, and (3) a ground voltage; and providing the first voltage to a first gate of a first transistor in response to an enable signal for turning the switch off.

Optionally, the first transistor may comprise an NMOS transistor.

Optionally, the method may further include: biasing a second circuit to provide a second voltage, wherein the second voltage is the highest one of (1) the voltage of the first pad, (2) the voltage of the second pad, and (3) a supply voltage; and providing the second voltage to a second gage of a second transistor in response to the enable signal for turning the switch off.

Optionally, the second transistor may comprise a PMOS transistor.

Other and further aspects and features will be evident from reading the following detailed description.

BRIEF DESCRIPTION OF THE DRAWINGS

The drawings illustrate the design and utility of various features, in which similar elements are referred to by common reference numerals. These drawings are not necessarily drawn to scale. In order to better appreciate how the above-recited and other advantages and objects are obtained, a more particular description of the features will be rendered which are illustrated in the accompanying drawings. These drawings depict only exemplary features and are not therefore to be considered limiting of the scope of the claims.

FIGS. 2-1 and 2-2 illustrate other examples of a component of a switch system.

FIGS. 3-1 and 3-2 illustrate other examples of a component of a switch system.

DETAILED DESCRIPTION

Figure 1:
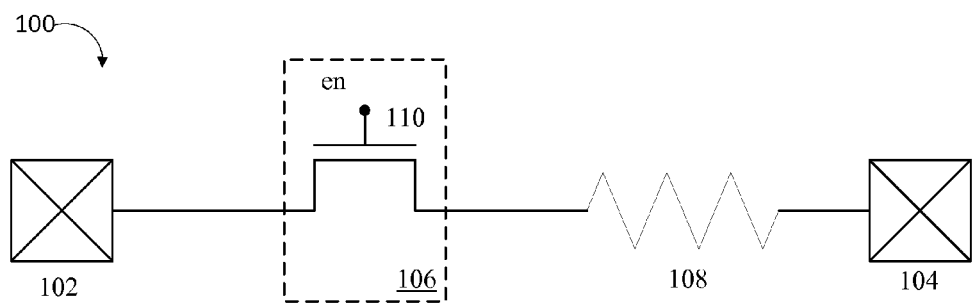
FIGS. 1-1 and 1-2 illustrate examples of a component of a switch system.

Various features are described hereinafter with reference to the figures. It should be noted that the figures are not drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated feature need not have all the aspects or advantages shown. An aspect or an advantage described in conjunction with a particular feature is not necessarily limited to that feature and can be practiced in any other features, even if not so illustrated, or if not explicitly described.

FIG. 1-1 illustrates an example of a component 100 of a signal (or switch) system that may be implemented for a variety of I/O interfaces. In the component 100, pads 102 and 104 are connected by a switch 106 and a resistor 108. The switch 106 is a transistor-based switch. In some cases, the pads 102 and 104 may be used for single-ended signaling and may operate independent of each other. In other cases, the pads 102 and 104 may be parts of a differential signal system, where the difference between the voltages on the two pads 102, 104 indicates a logic high or a logic low. The transistor-based switch 100 may be used for differential signal systems as part of a differential termination scheme in order to improve signal integrity. By creating a path between the pads on the receive side of the signal, the signals will appear cleaner to the receiver.

In some cases, such as when the switch is used as a differential termination switch, it may be desirable for the resistance between the pads 102 and 104 to match a predetermined value. For example, in some differential termination schemes, a resistance of approximately 100 ohms (e.g., 100 ohms±10 ohms) may be desired. Therefore the switch 106 may be sized in order to achieve a certain resistance. For example, in some differential termination schemes, the resistor 108, which tends to vary less over different voltage and temperature conditions, may be configured to be 80 ohms, while the switch 106 may be configured to have a resistance of 20 ohms.

In FIG. 1-1, the switch 106 includes a single NMOS transistor 110. The gate of NMOS transistor 110 is controlled by an enable signal (EN). When EN is low, current does not flow through NMOS transistor 110, and the switch is off. When EN is high, the switch is on. In some cases, the enable signal EN is driven by an inverter (not shown) tied to ground and supply.

However, there may be a number of problems associated with the configuration of the transistor-based switch 100 of FIG. 1-1. These problems occur when voltages on the pads 102 and 104 cause the switch 106 to be (1) off when it should be on, and (2) to be on when it should be off.

A first problem may occur when the voltage at the source or drain of NMOS transistor 110 rises to within a threshold voltage from the supply voltage. This causes NMOS transistor 110 to switch off when it should be on. To solve this problem, a PMOS transistor may be placed in parallel with NMOS transistor 110.

Figures 1, 2:
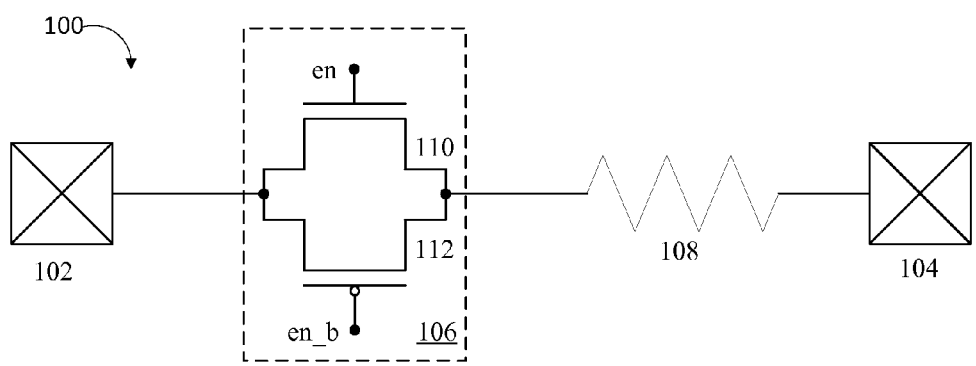
Figures 1, 2:
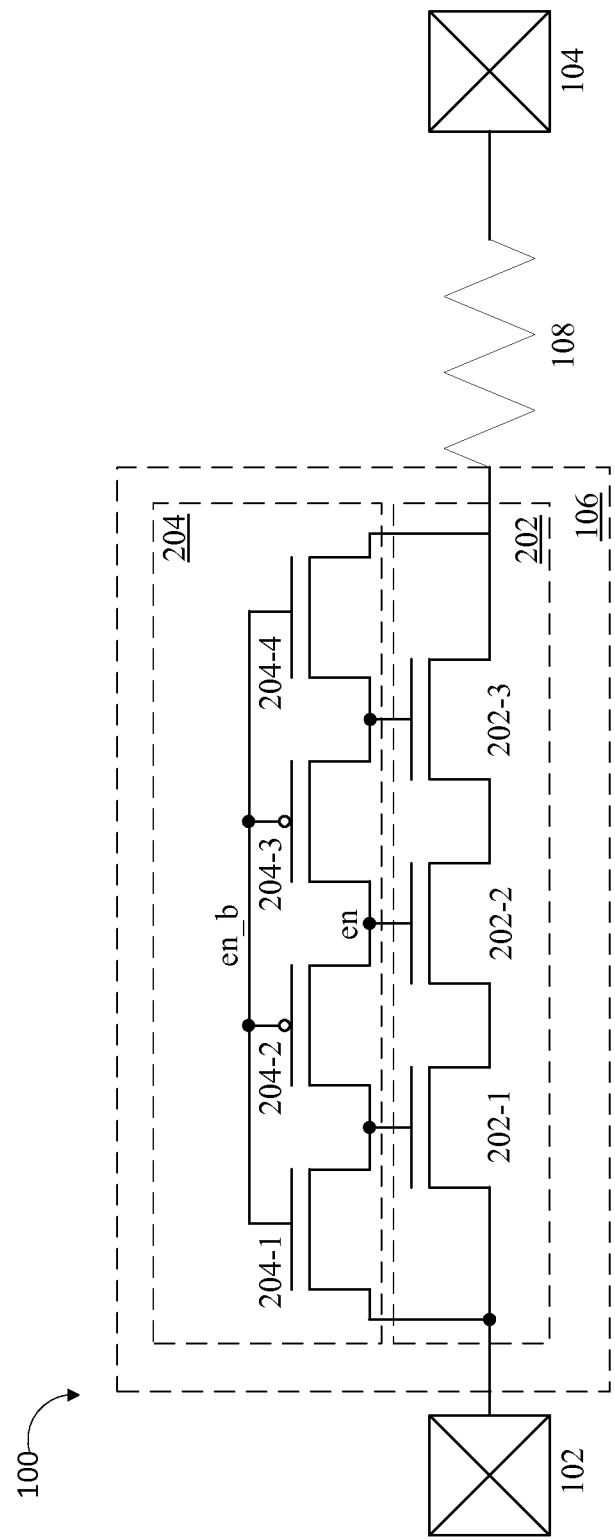
Figure 2:
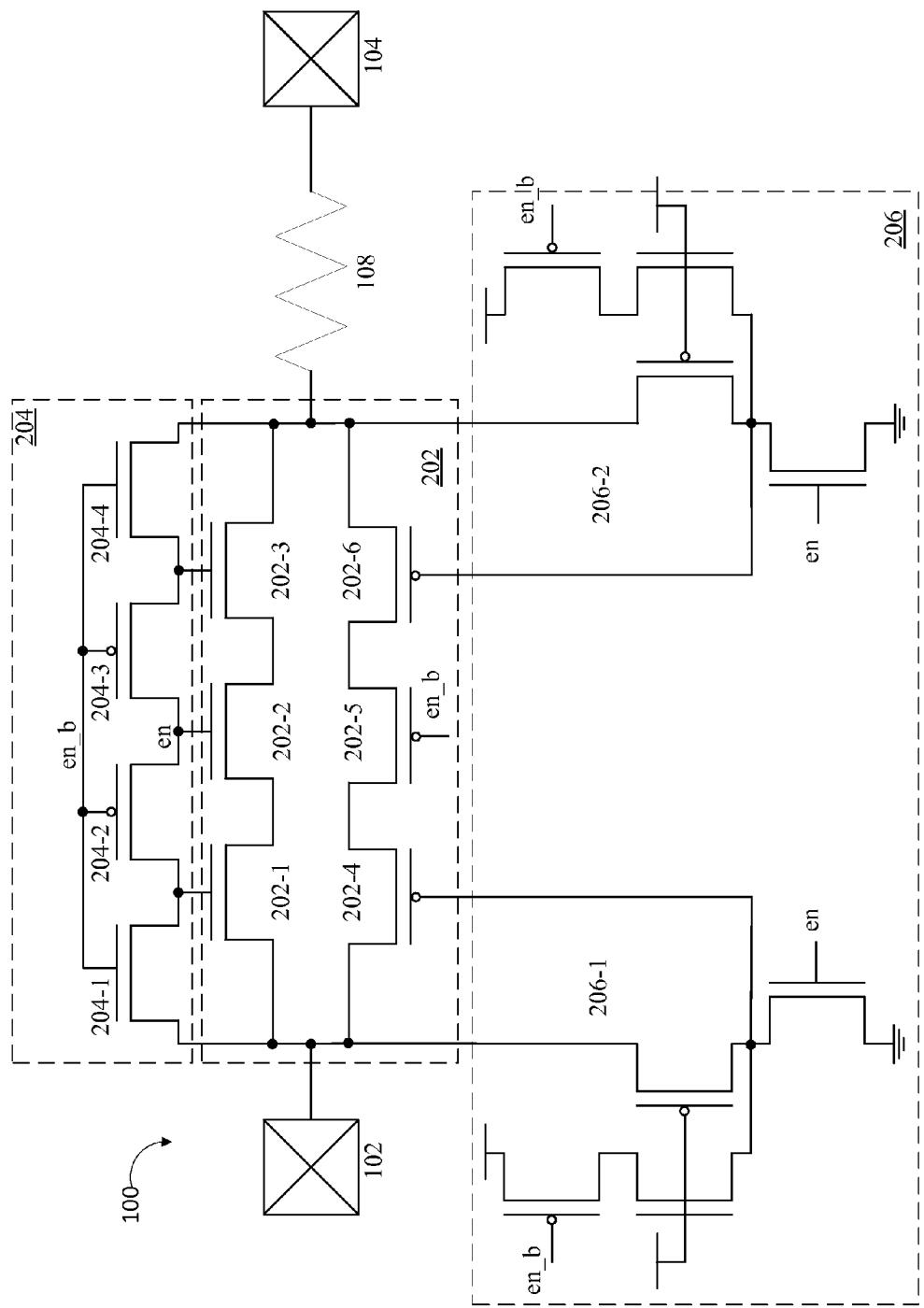

FIG. 1-2 illustrates an example of such an implementation. In FIG. 1-2, switch 106 comprises an NMOS transistor 110 and a PMOS transistor 112 connected in parallel. The gate of PMOS transistor 112 receives the inverse of the enable signal (EN_bar or "EN_b"), so that the gate of NMOS 110 will be high when the gate of PMOS transistor 112 is low, and vice versa. Because PMOS 112 transistor turns on when the EN_b is low and turns off when it is high, PMOS transistor 112 may not experience the problem of NMOS transistor 110 of turning off when the voltage on the source or drain comes within threshold of the supply voltage.

In some cases, the PMOS transistor 112 may experience the opposite problem. In particular, voltage at the source or drain of the PMOS 112 approaching to within threshold of ground may cause the PMOS transistor 112 to shut off when it should be on. However, when this happens current may still flow through the NMOS transistor 110. Therefore, by using both the NMOS transistor 110 and the PMOS transistor 112, the voltages on the pads 102 and 104 may approach supply and ground without causing the switch to turn off when it should be on because at least one of NMOS transistor 110 and PMOS transistor 112 will remain on.

A second problem may occur when voltages on the pads 102 and 104 rise above supply or fall below ground, which can cause the switch 106 to turn on when it should be off. Due to inductances in the system, transitions from a high to a low voltage and vice versa may cause the signal to overshoot above supply or undershoot below ground. When the signal on the pad 102 or 104 undershoots so that the voltage on the pad 102 or 104 is below ground, the NMOS transistor 110 may switch on when it is supposed to be off. When the signal on the pad 102 or 104 overshoots so that the voltage on the pads 102, 104 is greater than the supply voltage, the PMOS transistor 112 may switch on when it is supposed to be off. Thus may be a need for a switch that remains off even when its terminals overshoot or undershoot.

FIGS. 2-1 and 2-2 illustrate an example of a component 100 of a signal system that includes a switch 106 designed to solve the above-described problem. As shown in FIG. 2-1, the switch 106 has three NMOS transistors 202 (i.e., NMOS transistors 202-1, 202-2, 202-3) coupled in series between pads 102 and 104. NMOS transistors 202 are coupled with a circuit 204 comprising two NMOS transistors 204-1, 204-2 and two PMOS transistors 204-3, 204-4.

When the switch is on, EN is high, and EN_b is low. This causes the PMOS transistors 204-2 and 204-3 to be on, while the NMOS transistors 204-1 and 204-4 are off. Thus the gates of all three NMOS transistors 202-1, 202-2, and 202-3 will receive the high EN signal, so that all three NMOS transistors 202-1, 202-2, 202-3 are on, allowing current to flow between the pads 102 and 104.

When the switch is off, EN is low, and EN_b is high. This turns off the PMOS transistors 204-2 and 204-3, and turns on the NMOS transistors 204-1 and 204-4. This causes the NMOS transistors 202-2 to receive EN at its gate, while the gate of the NMOS transistor 202-1 receives the voltage on the pad 102 through the NMOS transistor 204-1, and the gate of NMOS transistor 202-3 receives the voltage on the pad 104 through the NMOS transistor 204-4. Therefore, if the voltage on the pad 102 undershoots, the NMOS transistor 202-1 will remain off. If the voltage on the pad 104 undershoots, the NMOS 202-3 transistor will remain off.

This implementation thus ensures that even if the voltage on the pad 102 or 104 drops below ground, at least one of the NMOS transistors 202-1, 202-2, 202-3 between the pads 102 and 104 will remain off. As long as at least one of the NMOS transistors 202-1, 202-2, 202-3 remains off, the switch 106 will be off.

FIG. 2-2 illustrates the component 100 of FIG. 2-1, further including a series of PMOS transistors 202-4, 202-5, 202-6, and circuit 206, which respectively mirror the configuration of the NMOS transistors 202-1, 202-2, and 202-3 and the circuit 204. In FIG. 2-2, the middle PMOS transistor 202-5 is configured to receive EN_b at its gate. The PMOS transistors 202-4 and 202-6 are connected to circuit 206, with the gate of the PMOS transistor 202-4 connected with the output of the circuit 206-1, and the gate of the PMOS transistor 202-6 connected with the output of the circuit 206-2. The circuit 206 is configured so that the PMOS transistors 202-4 and 202-6 receive EN_b when the switch is on, and receive the voltage from pads 102 and 104 respectively when the switch is off, mirroring the configuration of the NMOS transistors 202-1, 202-2, and 202-3 and the circuit 204. This configuration ensures that at least one of the PMOS transistors 202-4, 202-5, and 202-6 remains off when the switch is off, even if the voltage on the pad 102 or 104 overshoots above supply voltage.

However, there are a number of disadvantages associated with this implementation. Because there are three sets of transistors coupled in series between the pads 102, 104 compared to the one set of transistors as in FIGS. 1-1 and 1-2, in order for the switch 106 in FIGS. 2-1 and 2-2 to achieve the same resistance, each transistor in FIGS. 2-1 and 2-2 may need to be three times the size of the transistor in FIGS. 1-1 and 1-2. This results in a total area cost that is nine times greater than a configuration with only one set of transistors between the pads 102, 104. Second, larger transistors 202 may create larger capacitance loads on the pads 102 and 104. When driving the signals on the pads 102, 104, the higher the capacitance load on the pad, the longer it will take for the signal to switch from a logic high to a logic low, and vice versa. Third, larger transistors may experience a higher amount of channel leakage. This may result in a small amount of current flow through the switch 106 even when it is supposed to be off.

Thus, for at least the foregoing reasons, it may be desirable to reduce the size and number of the transistors on the switch 106.

Figures 1, 3:
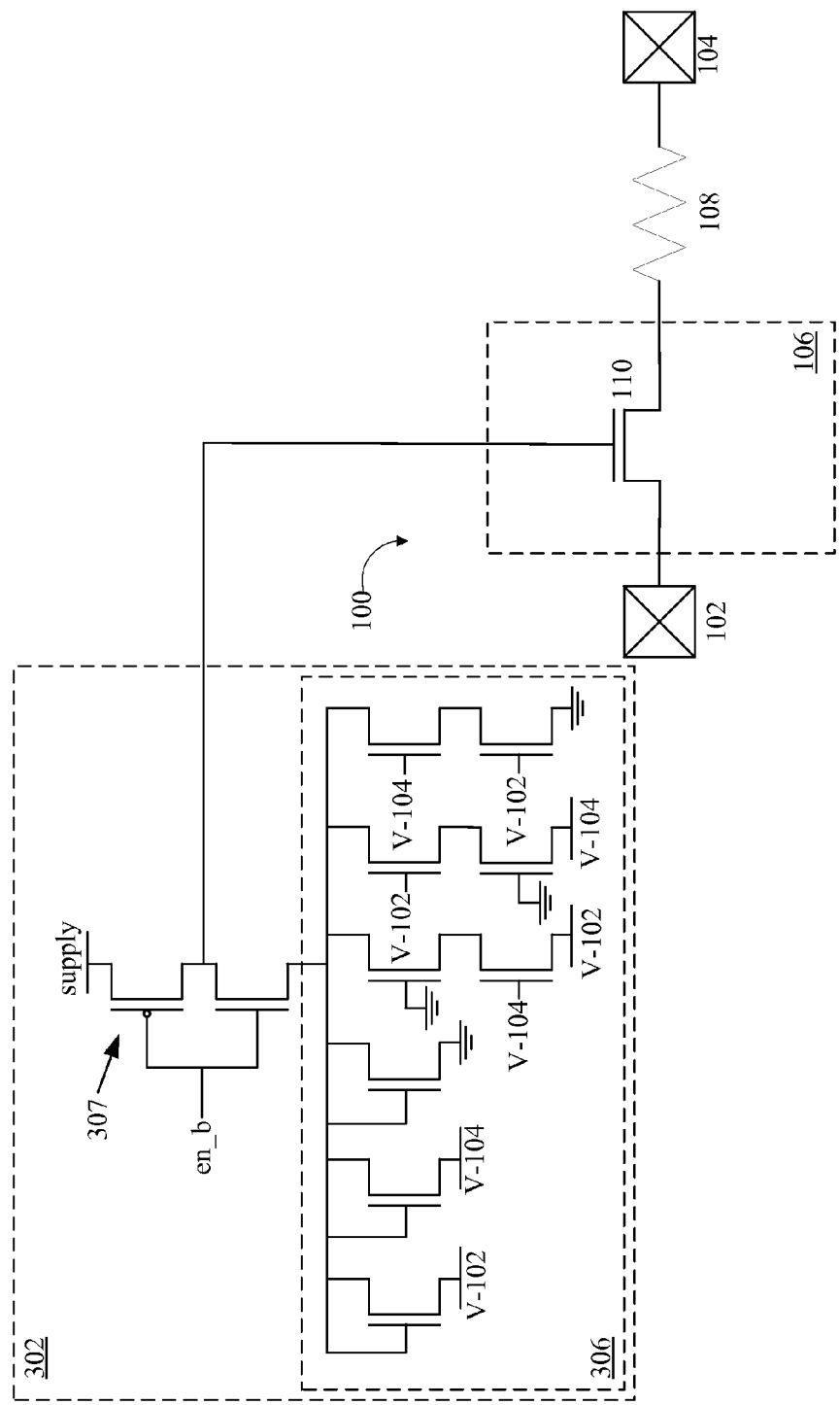
Figures 2, 3:
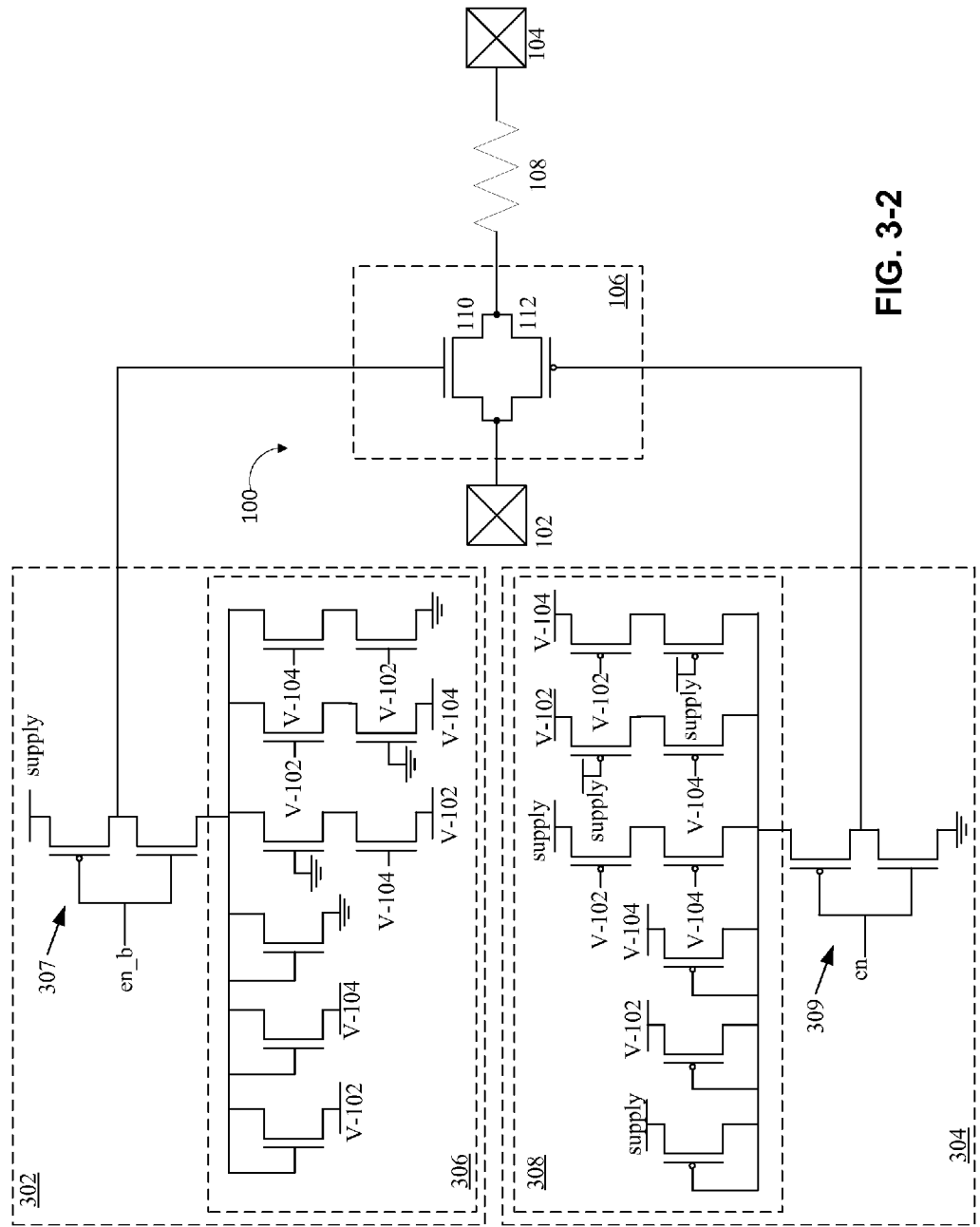

FIGS. 3-1 illustrates a component 100 for a signal system that includes a switch 106 and a circuit 302 coupled to the switch 106. The switch 106 in FIG. 3-1 uses a single NMOS transistor 110, similar to that shown in FIG. 1-1. The gate of the NMOS transistor 110 is connected to circuit 302. In some cases, the circuit 302 may be considered as a component of the switch 106.

The circuit 302 includes an inverter 307 that receives EN_b as input, and a biasing circuit 306. However, instead of being tied to ground and supply, the inverter 307 of the circuit 302 is tied to supply and the output of the biasing circuit 306, so that it outputs the supply voltage when the EN_b input is low (i.e., which corresponds to a high EN for configuring the switch to be on), and outputs the output of the biasing circuit 306 when the EN_b input is high (i.e., which corresponds to a low EN for configuring the switch to be off). Thus, when EN is high (corresponding to a desire to switch the switch 106 on), the gate of the NMOS transistor 110 receives the supply voltage through the inverter 307, and current flows through the switch 106.

On the other hand, when EN is low (corresponding to a desire to switch the switch 106 off), the gate of the NMOS transistor 110 receives the output of the biasing circuit 306. The biasing circuit 306 includes multiple NMOS transistors. The gates of the NMOS transistors in the biasing circuit 306 are connected to either have the voltage on pad 102 (V-102), the voltage on pad 104 (V-104), or ground. The biasing circuit 306 is configured to output the lowest of these three voltages (V-102, V-104, and ground). With this configuration, when the switch 106 is off, the NMOS transistor 110 will remain off even if the voltage on the pads 102 or 104 falls below ground because the voltage on the pads 102, 104 will not be able to fall below the gate voltage of the NMOS transistor 110. This is because when the switch 106 is off, the gate of NMOS 110 will receive the output of biasing circuit 306, which will be the lowest of voltages V-102, V-104, and ground. For example, if voltage on pad 102 falls below ground and becomes the lowest of the three voltages, the NMOS transistor 110 will not switch on due to the voltage on one of the pads 102, 104 being lower than the voltage on the gate of NMOS transistor 110, since the gate of NMOS transistor 110 will be receiving V-102 (which is lower than ground in the example) instead of ground.

Biasing circuits have been described in U.S. Pat. No. 8,228,115, the entire disclosure of which is hereby incorporated by reference. Thus, operation of the biasing circuit 306 will not be described in further detail. However, it should be noted that the biasing circuit 306 is not limited to the example illustrated and discussed, and that other types of biasing circuit for outputting or selecting the lowest voltage from the voltages on the pad 102, pad 104, and ground, respectively, may be used in the component 100.

FIG. 3-2 illustrates the component 100 of FIG. 3-1, further including a PMOS transistor 112 in the switch 106, and a circuit 304. The PMOS transistor 112 and the circuit 304 respectively mirror the configuration of the NMOS transistor 110 and the circuit 302. The circuit 304 includes an inverter 309 and a biasing circuit 308. The gate of the PMOS transistor 112 is connected to the inverter 309. The inverter 309 in the circuit 304 mirrors the inverter 302 in the circuit 302, and is tied to ground and the output of a biasing circuit 308.

During use, the inverter 309 in the circuit 304 receives EN as input, and is configured to output the output of the biasing circuit 308 when the input EN is low (i.e., for configuring the switch to be off). Thus, when EN is low (corresponding to a desire to switch the switch 106 off), the gate of the PMOS transistor 112 receives the highest voltage of a supply voltage, a voltage V-102 on pad 102, and a voltage V-104 on pad 104 from the biasing circuit 308. However, when EN is high (corresponding to a desire to switch the switch 106 on), the gate of the PMOS transistor 112 will be coupled to ground via the inverter 309. Biasing circuits that may be used to implement the biasing circuit 308 have been described in U.S. Pat. No. 8,228,115. Thus, operation of the biasing circuit 308 will not be described in further detail. It should be noted that the biasing circuit 308 is not limited to the example illustrated and discussed, and that other types of biasing circuit may be used.

The biasing circuit 308 comprises multiple PMOS transistors which receive at their gates V-102, V-104, or the supply voltage (as illustrated in the figure), and is configured to output the highest of the three voltages (V-102, V-104, and the supply voltage). Using this configuration, when the switch 106 is off, the PMOS transistor 112 will remain off even if the voltage on pads 102 or 104 rises above supply because the voltage on the pads 102, 104 will not rise above the gate voltage of the PMOS transistor 112. This is because when the switch 106 is off (EN will be low), the gate of PMOS transistor 112 will be coupled to receive the highest voltage of V-102, V-104, and supply voltage. For example, if voltage on pad 102 rises above the supply voltage, and the V-102 voltage becomes the highest of the three voltages, the PMOS transistor 112 will not switch off due to the voltage on one of the pads 102, 104 being higher than the voltage on the gate of PMOS transistor 112, since the gate of PMOS transistor 112 will be receiving V-102 (which is higher than the supply voltage) instead of the supply voltage. Therefore the implementation of FIG. 3-2 solves both the problems of the switch 1) being off when it should be on, and (2) being on when it should be off.

Because the switch 106 of FIG. 3-2 uses only two transistors 110, 112 (the NMOS transistor 110 and PMOS transistor 112) between the pads 102 and pads 104, like that shown in FIG. 1-2, the NMOS transistor 110 and the PMOS transistor 112 in FIG. 3-2 may be sized the same as those in FIG. 1-2. Because the NMOS transistor 110 and the PMOS transistor 112 in the component 100 of FIG. 3-1 or 3-2 are smaller than the series of NMOS transistors and PMOS transistors 202 in FIGS. 2-1 and 2-2, this implementation does not suffer from the increased capacitance and leakage caused by the larger transistors in the implementation illustrated in FIGS. 2-1 and 2-2.

While the biasing circuits 306 and 308 do consume additional area, the transistors in the biasing circuits 306 and 308 do not need to be configured for a particular resistance. Instead, these transistors may only need to be large enough to be able to control the gates of the NMOS transistor 110 and the PMOS transistor 112.

Figure 4:
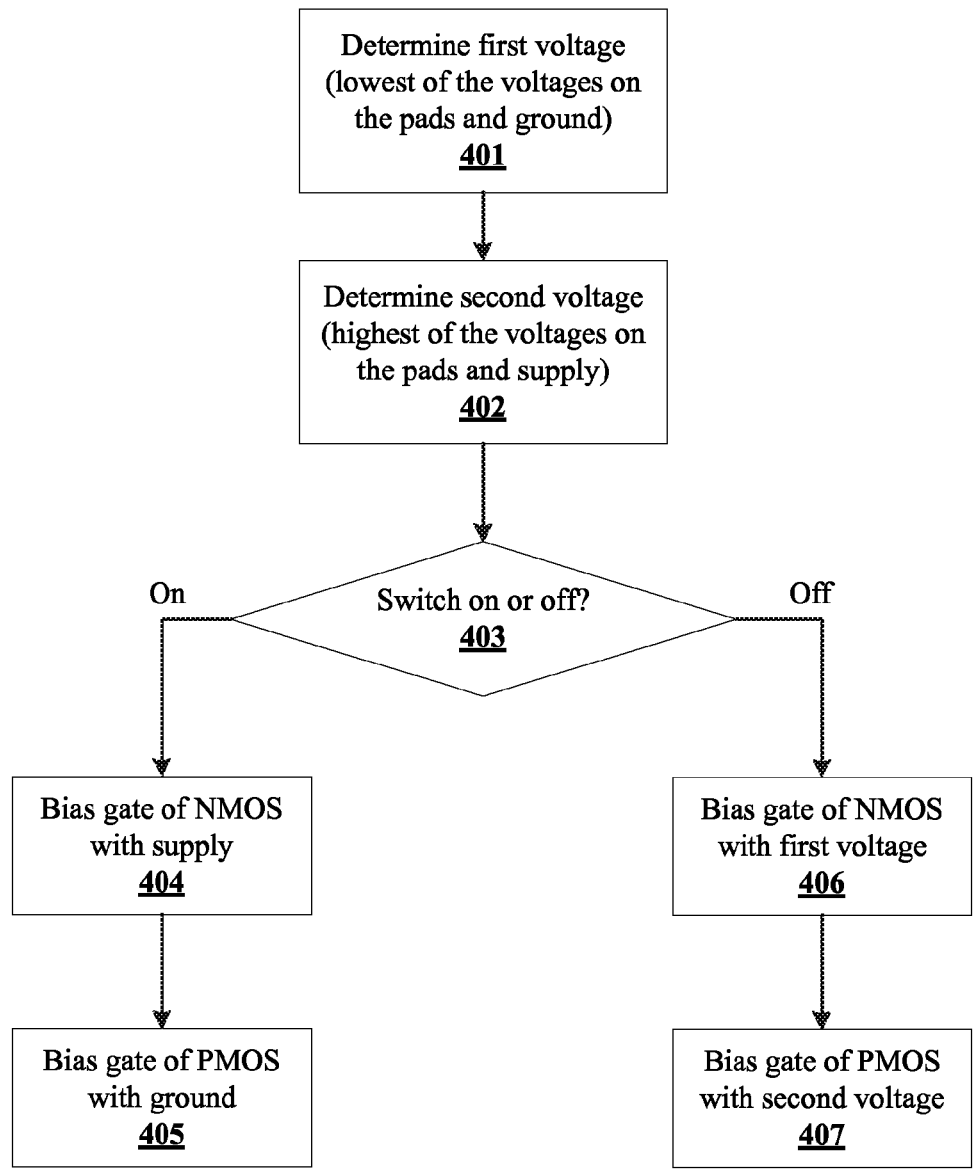
FIG. 4 illustrates a method for configuring a switch.

FIG. 4 illustrates a method of configuring a switch comprising a single set of NMOS and PMOS transistors connected in parallel between two pads, so that the switch remains off even when a voltage at a terminal (connecting to one of the pads) of the switch overshoots to above supply or undershoots to below ground. First, at 401, a first voltage is determined that is the lowest of the voltages of the terminals of the switch and ground. In the configuration illustrated in FIGS. 3-1 and 3-2, this is performed by the biasing circuit 306, which determines the lowest of the voltage on pad 102, the voltage on pad 104, and ground. At 402, a second voltage that is the highest of the voltages of the terminals of the switch and supply is determined. In the configuration illustrated in FIG. 3-2, this determination is performed by circuit 308. This determination (item 402) is optional and is not included in the configuration shown in FIG. 3-1.

At 403, a determination is made as to whether the switch is desired to be turned on or off. In some cases, the desired state of the switch is determined by the EN signal. If EN is high, then the switch is intended to be on. If EN is low, then the switch is intended to be off. If the switch is desired to be on, the gate of the NMOS transistor 110 is biased with the supply voltage at 404, while the gate of the PMOS transistor 112 is biased with ground at 405. If the switch is desired to be switched off, the gate of the NMOS transistor 112 is biased with a first voltage at 406, and the gate of the PMOS transistor 112 is biased with a second voltage at 407. The first voltage in item 406 is the lowest of the voltages V-102, V-104, and ground, as determined by the first biasing circuit 306. The second voltage in item 407 is the highest of the voltages V-102, V-104, and supply, as determined by the second biasing circuit 308. Also, as discussed with reference to FIG. 3-2, the acts of biasing the gates of the NMOS transistor 110 and the PMOS transistor 112 are performed by inverters 307 and 309, respectively. In particular, the inverter 307 is configured to output the supply voltage when the switch is on, and the first voltage when the switch is off, while the inverter 309 is configured to output ground when the switch is on, and the second voltage when the switch is off. A switch configured in this way will be prevented from turning on due to overshoots and undershoots when it is supposed to be off, because the voltage of the terminals will not be able to be higher than the gate voltage of the NMOS or be lower than the gate voltage of the PMOS when the switch is turned off.

Although particular features have been shown and described, it will be understood that they are not intended to limit the claimed invention, and it will be clear to those skilled in the art that various changes and modifications may be made without departing from the scope of the claimed invention. The specification and drawings are, accordingly, to be regarded in an illustrative rather than restrictive sense. The claimed invention is intended to cover alternatives, modifications, and equivalents.

The invention claimed is:

1. An apparatus, comprising:
   a switch having a first transistor, the first transistor having a gate, wherein the switch is connected between a first pad and a second pad; and
   a first biasing circuit coupled to the gate of the first transistor, wherein the first biasing circuit is configured for outputting a first voltage, the first voltage being the lowest one of (1) a voltage of the first pad, (2) a voltage of the second pad, and (3) a ground voltage;
   wherein the gate of the first transistor is driven by the first voltage from the first biasing circuit in response to an enable signal being set for configuring the switch to be off.

2. The apparatus of claim 1, wherein the first transistor, when switched off, remains off when the voltage of the first pad or the voltage of the second pad is below the ground voltage.

3. The apparatus of claim 1, further comprising an inverter coupled between the first biasing circuit and the gate of the first transistor.

4. The apparatus of claim 1, wherein the first transistor comprises an NMOS transistor.

5. The apparatus of claim 1, further comprising a second transistor connected in parallel to the first transistor.

6. The apparatus of claim 5, further comprising a second biasing circuit coupled to a gate of the second transistor, wherein the second biasing circuit is configured for outputting a second voltage, the second voltage being the highest one of (1) the voltage of the first pad, (2) the voltage of the second pad, and (3) a supply voltage.

7. The apparatus of claim 5, wherein the second transistor, when switched off, remains off when the voltage of the first pad or the voltage of the second pad is above the supply voltage.

8. The apparatus of claim 5, wherein the second transistor comprises a PMOS transistor.

9. The apparatus of claim 5, further comprising an inverter coupled between the second biasing circuit and the gate of the second transistor.

10. The apparatus of claim 1, further comprising a resistor, wherein the first transistor is connected in series with the resistor.

11. The apparatus of claim 1, wherein the switch is a part of a differential signal system.

12. An apparatus, comprising:
    a switch having a first transistor, the first transistor having a gate, wherein the switch is connected between a first pad and a second pad; and
    a first biasing circuit coupled to the gate of the first transistor, wherein the first biasing circuit is configured for outputting a first voltage, the first voltage being the highest one of (1) a voltage of the first pad, (2) a voltage of the second pad, and (3) a supply voltage;
    wherein the gate of the first transistor is driven by the first voltage from the first biasing circuit in response to an enable signal being set for configuring the switch to be off.

13. The apparatus of claim 12, further comprising an inverter coupled between the first biasing circuit and the gate of the first transistor.

14. The apparatus of claim 12, wherein the first transistor comprises a PMOS transistor.

15. The apparatus of claim 12, further comprising a resistor, wherein the first transistor is connected in series with the resistor.

16. The apparatus of claim 12, wherein the switch is a part of a differential signal system.

17. A method for configuring a switch connected between a first pad and a second pad, comprising:
   biasing a first circuit to provide a first voltage, wherein the first voltage is the lowest one of (1) a voltage of the first pad, (2) a voltage of the second pad, and (3) a ground voltage; and
   providing the first voltage to a first gate of a first transistor in response to an enable signal for turning the switch off.

18. The method of claim 17, wherein the first transistor comprises an NMOS transistor.

19. The method of claim 17, further comprising:
   biasing a second circuit to provide a second voltage, wherein the second voltage is the highest one of (1) the voltage of the first pad, (2) the voltage of the second pad, and (3) a supply voltage; and
   providing the second voltage to a second gage of a second transistor in response to the enable signal for turning the switch off.

20. The method of claim 19, wherein the second transistor comprises a PMOS transistor.

* * * * *